(12) United States Patent
Jin et al.

(10) Patent No.: US 11,967,656 B2
(45) Date of Patent: Apr. 23, 2024

(54) PHOTOVOLTAIC CELL, METHOD FOR PREPARING SAME, AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Bike Zhang, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/343,726

(22) Filed: Jun. 28, 2023

(65) Prior Publication Data
US 2024/0006543 A1     Jan. 4, 2024

Related U.S. Application Data

(63) Continuation of application No. 18/167,039, filed on Feb. 9, 2023, now Pat. No. 11,810,984.

(30) Foreign Application Priority Data

Jun. 30, 2022 (CN) .......................... 202210779014.2

(51) Int. Cl.
*H01L 31/0216* (2014.01)
*H01L 31/048* (2014.01)
*H01L 31/18* (2006.01)

(52) U.S. Cl.
CPC .... *H01L 31/02168* (2013.01); *H01L 31/1868* (2013.01); *H01L 31/048* (2013.01)

(58) Field of Classification Search
CPC ............. H01L 31/02168; H01L 31/048; H01L 31/1868
See application file for complete search history.

(56) References Cited

U.S. PATENT DOCUMENTS

| 2005/0156284 A1 | 7/2005 | Schmidt |
| 2006/0130891 A1 | 6/2006 | Carlson |

(Continued)

FOREIGN PATENT DOCUMENTS

| CN | 108447918 A | 8/2018 |
| CN | 109713065 A | 5/2019 |

(Continued)

OTHER PUBLICATIONS

Zhejiang Jinko Solar Co., Ltd., et al., Notice of Allowance, U.S. Appl. No. 18/167,039, dated Jun. 7, 2023, 10 pgs.

(Continued)

*Primary Examiner* — Golam Mowla
(74) *Attorney, Agent, or Firm* — USCH Law, PC

(57) ABSTRACT

A photovoltaic cell is provided, including a substrate and a passivation layer on the substrate. The passivation layer includes first portions and second portions interleaved with each other in a direction perpendicular to a normal of the first surface of the substrate. The first and second portions are doped with a same type of doping elements, each second portion has a reference surface away from the substrate, a doping concentration of doping elements in a second portion gradually decreases in a direction from a center of the reference surface toward an adjacent first portion and in a direction from the center of the reference surface toward the substrate, and a doping concentration of doping elements in the first portion is less than or equal to a minimum doping concentration of doping elements in the second portion.

20 Claims, 2 Drawing Sheets

(56) References Cited

U.S. PATENT DOCUMENTS

| | | |
|---|---|---|
| 2007/0278626 A1 | 12/2007 | Fuchs et al. |
| 2011/0097840 A1 | 4/2011 | Ramappa |
| 2012/0048366 A1 | 3/2012 | Mai et al. |
| 2013/0087191 A1 | 4/2013 | Tan et al. |
| 2013/0199604 A1 | 8/2013 | Shumate et al. |
| 2015/0303318 A1 | 10/2015 | Tanaka et al. |
| 2017/0179310 A1 | 6/2017 | Westerberg et al. |
| 2018/0083149 A1 | 3/2018 | Kim et al. |

FOREIGN PATENT DOCUMENTS

| | | |
|---|---|---|
| CN | 109841693 A | 6/2019 |
| CN | 210926046 U | 7/2020 |
| CN | 112820793 A | 5/2021 |
| CN | 213519984 U | 6/2021 |
| CN | 113471336 A | 10/2021 |
| CN | 113675289 A | 11/2021 |
| CN | 114464689 A | 5/2022 |
| CN | 115000213 A | 9/2022 |
| EP | 2472592 A2 | 7/2012 |
| EP | 4002487 A1 | 5/2022 |
| JP | 2007109972 A | 4/2007 |
| JP | 2008004726 A | 1/2008 |
| JP | 2015146335 A | 8/2015 |
| JP | 7168800 B1 | 11/2022 |
| KR | 20150014298 A | 2/2015 |
| KR | 20180036382 A | 4/2018 |

OTHER PUBLICATIONS

Zhejiang Jinko Solar Co., Ltd., et al., Extended European Search Report, EP 23155926.1, Dec. 6, 2023, 12 pgs.

S. Yuan, et al., "Passivated Emitter and Rear Cell Silicon Solar Cells with a Front Polysilicon Passivating Contacted Selective Emitter", Physica Status Solidi. Rapid Research Letters, vol. 15, No. 7, art. 2100057, May 22, 2021, 5 pgs.

Yang G et al., "Design and application of ion-implanted polySi passivating contacts for interdigitated back contact c-Si solar cells", Appl.Phys.Letters, vol. 18, No. 3, Jan. 18, 2016, 4 pgs.

Firat M, et al., "In situ phosphorus-doped polycrystalline silicon films by low pressure chemical vapor deposition for contact passivation of silicon solar cells", Solar Energy, vol. 231, Nov. 26, 2021, 10 pgs.

Zhejiang Jinko Solar Co., Ltd., et al., Notice of Reasons for Refusal with English translation, JP 2023-020653, Mar. 1, 2024, 8 pgs.

PHOTOVOLTAIC CELL, METHOD FOR PREPARING SAME, AND PHOTOVOLTAIC MODULE

CROSS-REFERENCE TO RELATED APPLICATION

The present application is a continuation of U.S. patent application Ser. No. 18/167,039, filed on Feb. 9, 2023, which claims the benefit of priority under the Paris Convention to Chinese Patent Application No. 202210779014.2 filed on Jun. 30, 2022, each of which is incorporated herein by reference in its entirety.

TECHNICAL FIELD

Embodiments of the present disclosure relate in general to photovoltaic technology, and more particularly to a photovoltaic cell, a method for preparing the same, and a photovoltaic module.

BACKGROUND

Photovoltaic cells are semiconductor devices that convert solar energy into electrical energy. In order to reduce surface recombination and metal contact recombination effectively, more and more manufacturers have applied tunneling oxide passivation contact solar cell technology based on selective carrier principle. Due to the need for good ohmic contact between an electrode and a substrate as well as improved short-wavelength spectral response in a sunlight incident portion, it is desired to have a high doping concentration in a portion of a passivation layer aligning with the electrode and a low doping concentration in an illuminated portion of the passivation layer.

However, due to the influence of the doping process, there is an abrupt change in the concentration of doping elements in the passivation layer, resulting in an abrupt change in a potential difference between the portion where the doping element concentration is high and the portion where the doping element concentration is low, which affects passivation effect of the passivation layer on the substrate.

SUMMARY

Some embodiments of the present disclosure provide a photovoltaic cell, a method for preparing the same, and a photovoltaic module, which are at least conducive to improving passivation effect of the passivation layer on the substrate while reducing a light absorption rate of a first portion, thereby improving photoelectric conversion efficiency of the photovoltaic cell.

Some embodiments of the present disclosure provide a photovoltaic cell including: a substrate; a passivation layer disposed on a first surface of the substrate, where the passivation layer includes a plurality of first portions and a plurality of second portions interleaved with each other in a direction perpendicular to a normal of the first surface of the substrate. The plurality of first portions and the plurality of second portions are doped with a same type of doping elements, each of the plurality of second portions has a reference surface away from the substrate, a doping concentration of doping elements in a respective second portion gradually decreases in a direction from a center of the reference surface toward an adjacent first portion and in a direction from the center of the reference surface toward the substrate, and a doping concentration of doping elements in the respective first portion is less than or equal to a minimum doping concentration of doping elements in the respective the second portion.

In some embodiments, the respective second portion further includes a third portion, a fourth portion, and a fifth portion, and a doping concentration of doping elements in the third portion is greater than a doping concentration of doping elements in the fourth portion, which is greater than a doping concentration of doping elements in the fifth portion. The third portion is closer to the center of the reference surface than the fourth portion, and the fourth portion is closer to the center of the reference surface than the fifth portion.

In some embodiments, the photovoltaic cell further includes a plurality of electrodes each disposed over at least a portion of the reference surface.

In some embodiments, a ratio of a maximum doping concentration of the doping elements in the respective second portion to a maximum doping concentration of the doping elements in the respective first portion is in a range of 3 to 4.

In some embodiments, the doping concentration of the doping elements in the respective first portion is in a range of $1 \times 10^{20}$ atom/cm$^3$ to $1.5 \times 10^{20}$ atom/cm$^3$, the maximum doping concentration of the doping elements in the respective second portion is in a range of $3 \times 10^{20}$ atom/cm$^3$ to $4 \times 10^{20}$ atom/cm$^3$, and the minimum doping concentration of the doping elements in the respective second portion is in a range of $1 \times 10^{20}$ atom/cm$^3$ to $1.5 \times 10^{20}$ atom/cm$^3$.

In some embodiments, a grain size of the respective first portion is greater than a grain size of the respective second portion.

In some embodiments, a ratio of the grain size of the respective first portion to the grain size of the respective second portion is in a range of 10 to 30.

In some embodiments, the grain size of the respective first portion is in a range of 100 nm to 300 nm and the grain size of the respective second portion is in a range of 10 nm to 30 nm.

In some embodiments, a number of grain boundaries in the respective first portion is less than a number of grain boundaries in the respective second portion.

In some embodiments, a ratio of the number of grain boundaries in the respective second portion to the number of grain boundaries in the respective first portion is in a range of 20 to 100.

In some embodiments, the number of grain boundaries in the respective first portion is in a range of 5 to 10 per um$^2$, and the number of grain boundaries in the respective second portion is in a range of 100 to 500 per um$^2$.

In some embodiments, a dislocation density of the respective first portion is less than a dislocation density of the second portion.

Some embodiments of the present disclosure provide a method for preparing a photovoltaic cell, including: providing a substrate; forming an initial passivation layer on a first surface of the substrate; and performing different treatments on different portions of the initial passivation layer using a doping process to form a passivation layer, wherein the passivation layer includes a plurality of first portions and a plurality of second portions interleaved with each other in a direction perpendicular to a normal of the first surface of the substrate. The plurality of first portions and the plurality of second portions are doped with a same type of doping elements, each of the plurality of second portions has a reference surface away from the substrate, a doping concentration of doping elements in a respective second portion gradually decreases in a direction from a center of the reference surface toward an adjacent first portion and in a direction from the center of the reference surface toward the substrate, and a doping concentration of doping elements in the respective first portion is less than or equal to a minimum doping concentration of doping elements in the respective the second portion.

In some embodiments, forming the passivation layer includes performing a first doping treatment on the initial passivation layer to form a plurality of initial first portions such that the plurality of initial first portions are doped with the doping elements; and performing a laser doping treatment on a part of a respective initial first portion such that the part of the respective initial first portion is converted into a second portion and a remaining portion of the respective initial first portion is taken as a first portion.

Some embodiments of the present disclosure provide a photovoltaic module including: at least one cell string, each of the at least one cell string formed by connecting a plurality of photovoltaic cells according to the above embodiments or a plurality of photovoltaic cells prepared by the method according to the above embodiments; at least one encapsulation adhesive film, each of the at least one encapsulation adhesive film configured to cover a surface of a respective cell string; and at least one cover plate, each of the at least one cover plate configured to cover a surface of a respective encapsulation adhesive film facing away from the respective cell string.

BRIEF DESCRIPTION OF THE DRAWINGS

One or more embodiments are described as examples with reference to the figures in the accompanying drawings, and the examples do not constitute a limitation to the embodiments. Elements with the same reference numerals in the accompanying drawings are represented as similar elements, and the features in the accompanying drawings do not constitute proportion limitation unless otherwise stated. In order to more clearly describe embodiments of the present disclosure or technical solutions in conventional technologies, the accompanying drawings required to be used in the embodiments are briefly described below. Apparently, the accompanying drawings in the following description are merely related to some embodiments of the present disclosure, and those of ordinary skills in the art may obtain other drawings from these drawings without creative efforts.

DETAILED DESCRIPTION OF THE EMBODIMENTS

Figure 1:
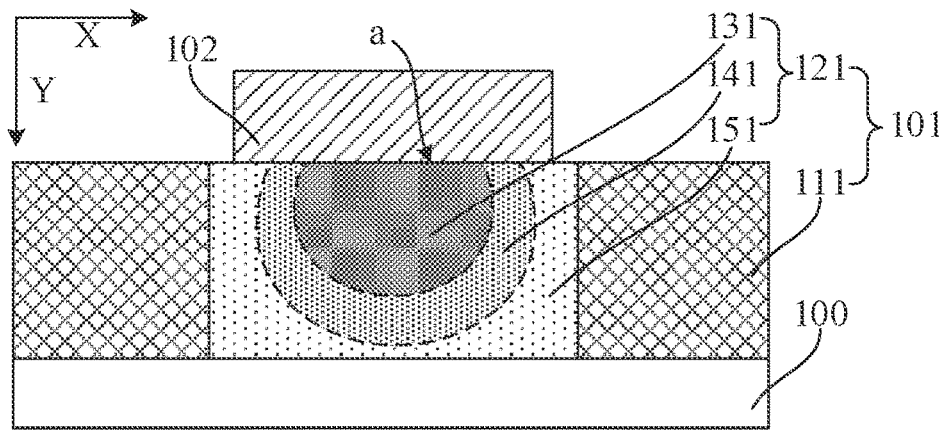
FIG. 1 is a schematic structural diagram of a photovoltaic cell according to an embodiment of the present disclosure.

It is seen from BACKGROUND that the passivation effect of the passivation layer on the substrate and the photoelectric conversion efficiency of the photovoltaic cell need to be improved while reducing the light absorption rate of the passivation layer.

It is found that in order to improve the photoelectric conversion efficiency of the photovoltaic cell, on the one hand, a doping concentration of doping elements in the passivation layer is low in a portion where the passivation layer is not in contact with the electrode, so as to reduce the light absorption rate of this portion; on the other hand, a doping concentration of doping elements in the passivation layer is high in a portion where the passivation layer is in contact with the electrode, so that an ohmic contact is formed between the passivation layer and the electrode, and a contact resistance between the passivation layer and the electrode is reduced.

However, since a difference between the concentration of doping elements in the portion not in contact with the electrode and that in the portion in contact with the electrode is large, there is an abrupt change phenomenon of the doping element concentration between the portion not in contact with the electrode and the portion in contact with the electrode, so that a potential difference between the two portions is abruptly changed, and not only carriers are easily recombined in the two portions, but also the resistance of the carriers from the portion not in contact with the electrode to the portion in contact with the electrode is increased, thereby reducing the transmission efficiency of the carriers in the passivation layer.

The present disclosure provides a photovoltaic cell, a method for preparing the photovoltaic cell, and a photovoltaic module. In the photovoltaic cell, a doping concentration of doping elements gradually increases in a direction of a first portion toward the second portion, and a doping concentration of doping elements in a first portion is less than a minimum doping concentration of doping elements in the second portion, which means that a potential barrier for carrier transmission gradually decreases from the first portion to the second portion and in the second portion and there is no abrupt change, so that the second portion has a wider width of a depletion region, which is conducive to prolonging a lifetime of minority carriers and enabling more minority carriers to be collected in the second portion. In this way, it is conducive to reducing consumption of the minority carriers to enhance the passivation effect of the second portion on the substrate, thereby reducing a composite current density between the electrode and the substrate, improving the photoelectric conversion efficiency of the photovoltaic cell and increasing an open circuit voltage and saturation current of the photovoltaic cell. Furthermore, the doping concentration of the doping elements in the second portion gradually increases in a direction from the substrate toward a center of a reference surface, which means that the potential barrier for carrier transmission is gradually reduced from the second portion to the electrode, which is conducive to gradually reducing transmission resistance of majority carriers, so as to improve the transmission efficiency of the majority carriers between the second portion and the electrode, thereby improving the photoelectric conversion efficiency of the photovoltaic cell.

In addition, the reference surface of the second portion is configured for contact with the electrode, and the doping concentration of the doping elements in the first portion is low while the doping element concentration of the doping elements in the second portion is high at the contact with the electrode. In this way, on the one hand, it is conducive to making the material of the second portion more compatible with the contact with the electrode to reduce the contact resistance between the second portion and the electrode, so as to increase the transmission efficiency of the majority carriers between the second portion and the electrode, thereby increasing the filling factor of the photovoltaic cell. On the other hand, it is conducive to reducing the doping concentration of the doping elements in the first portion, so as to reduce the light absorption rate of the first portion and improve the utilization rate of light in the photovoltaic cell.

Various embodiments of the present disclosure are described in detail below with reference to the accompanying drawings. Those of ordinary skill in the art should appreciate that many technical details have been proposed in various embodiments of the present disclosure in order to enable the reader to better understand the embodiments of the present disclosure. However, even without these technical details and various changes and modifications based on the following embodiments, the technical solutions in the embodiments of the present application are still able to be realized.

Figure 2:
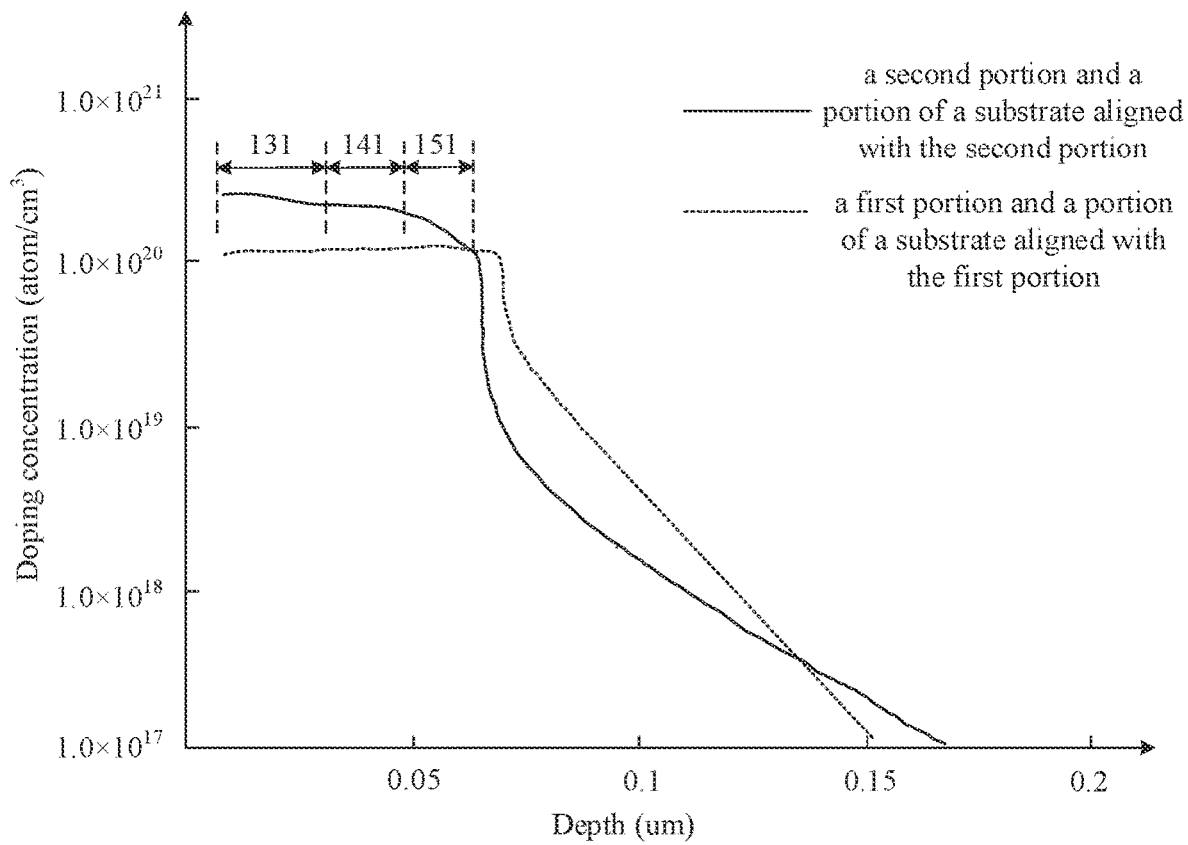
FIG. 2 is a graph of doping concentration variation of doping elements in a first portion, a second portion and a substrate in a photovoltaic cell according to an embodiment of the present disclosure.

Embodiments of the present disclosure provides a photovoltaic cell. The photovoltaic cell provided in the embodiments of the present disclosure are described in detail below with reference to the accompanying drawings. FIG. 1 is a schematic structural diagram of a photovoltaic cell according to an embodiment of the present disclosure. FIG. 2 is a graph of doping concentration variation of doping elements in a first portion, a second portion, and a substrate of a photovoltaic cell according to an embodiment of the present disclosure.

Referring to FIG. 1, the photovoltaic cell includes a substrate 100 and a passivation layer 101 disposed on a first surface of the substrate 100. The passivation layer 101 includes a plurality of first portions 111 and a plurality of second portions 121 interleaved with each other in a direction X perpendicular to a direction Y along a normal of the first surface of the substrate 100. The plurality of first portions 111 and the plurality of second portions 121 are doped with the same type of doping elements, each second portion 121 has a reference surface 'a' away from the substrate 100, a doping concentration of doping elements in a respective second portion 121 is gradually decreasing in a direction from a center of the reference surface 'a' toward an adjacent first portion 111 and in a direction from the center of the reference surface 'a' toward the substrate 100, and a doping concentration of doping elements in the first portion 111 is less than or equal to a minimum doping concentration of doping elements in the second portion 121.

It should be understood that, on the one hand, the doping concentration of the doping elements in the second portion 121 gradually increases in the direction of the first portion 111 toward the second portion 121, i.e., in the direction X, and a potential barrier for carrier transmission gradually decreases from the first portion 111 to the second portion 121 and in the second portion 121; on the other hand, the reference surface is configured for subsequent contact with the electrode, and the doping concentration of the doping elements in the second portion 121 also gradually increases in the direction from the substrate 100 toward the center of the reference surface 'a', so that the potential barrier for the carrier transmission gradually decreases from the second portion 121 to the electrode, which is conducive to reducing the transmission resistance of majority carriers and improving the transmission efficiency of the majority carriers between the passivation layer 101 and the electrode, thereby improving the photoelectric conversion efficiency of the photovoltaic cell.

In addition, in the direction X of the first portion 111 toward the second portion 121, the doping concentration of the doping elements in the second portion 121 tends to increase gradually, and the doping concentration of the doping elements in the first portion 111 is less than the minimum doping concentration of the doping elements in the second portion 121, so that an abrupt change phenomenon between the doping concentration of the doping elements in the first portion 111 and that in the second portion 121 does not exist, which is conducive to prolonging the lifetime of the minority carriers, thus more minority carriers are able to be collected by the second portion 121 to enhance the passivation effect of the second portion 121 on the substrate 100 so as to increase the open circuit voltage and the saturation current of the photovoltaic cell. In addition, it is ensured that the doping concentration of the doping elements in the first portion 111 is low while the doping concentration of the doping elements at the reference surface 'a' is high, which is conducive to reducing the light absorption rate of the first portion 111 while reducing the contact resistance between the second portion 121 and the electrode, thereby improving the light utilization rate of the photovoltaic cell.

Embodiments of the present disclosure are described below in more detail with reference to the accompanying drawings.

In some embodiments, the substrate 100 includes a silicon substrate material, which may include one or more of single crystal silicon, polysilicon, amorphous silicon, or microcrystalline silicon. In some embodiments, the material of the substrate may also include a carbon element, an organic material, or multicomponent compounds. The multicomponent compounds may include, but are not limited to, materials such as perovskite, gallium arsenide, cadmium telluride, copper indium selenium, and the like. In addition, a front surface of the substrate 100 may be provided as a pyramid texture surface to reduce light reflection on the front surface, increase absorption and utilization of light, and improve the conversion efficiency of the photovoltaic cell.

It should be noted that the substrate 100 has a front surface and a rear surface opposite to each other. For a single-sided cell, the front surface may be a light receiving surface, and the rear surface may be a backlighting surface. For a double-sided cell, both the front surface and the rear surface may be light receiving surfaces. In some embodiments, a surface of the substrate 100 in contact with the passivation layer 101 is the rear surface.

In some embodiments, the material of the passivation layer 101 may be doped polysilicon. The materials of both the first portion 111 and the second portion 121 may be doped polysilicon. If the doping concentration of the doping elements in the first portion 111 is different from that in the second portion 121, the first portion 111 and the second portion 121 may be formed using the same film layer structure, which is made of semiconductor elements, so that the first portion 111 and the second portion 121 are formed as an integral structure, thereby facilitating improvement of interface state defects between the first portion 111 and the second portion 121, and thus reducing the probability of carrier recombination due to defects at the interface when carriers migrate between the first portion 111 and the second portion 121.

In some embodiments, the doping element may include a P-type doping element or an N-type doping element. The P-type doping element may include at least one of a boron element, an aluminum element, a gallium element, an indium element, or a thallium element, and the N-type doping element may include at least one of a phosphorus element, an arsenic element, an antimony element, or a bismuth element. In some embodiments, a type of the doping elements in the passivation layer 101 is the same as a type of the doping elements in the substrate 100. The passivation layer 101 acts as a field passivation layer to achieve a field passivation effect.

In some embodiments, the passivation layer 101 has a thickness in a range of 30 nm to 150 nm in a direction Y from the center of the reference surface 'a' toward the substrate 100 (which is also the direction along a normal of the first surface of the substrate 100).

In some embodiments, the passivation layer 101 is in direct contact with the substrate 100, with at least a portion of the passivation layer 101 covering the surface of the substrate 100.

In some embodiments, a thin dielectric layer (not shown in FIG. 1) is disposed between the passivation layer 101 and the substrate 100, the thin dielectric layer is a tunneling layer to enable carriers to transmit to the passivation layer 101 by tunneling effect, and the thin dielectric layer facilitates chemical passivation of the surface of the substrate 100 to reduce interface state defects of the substrate 100. In some embodiments, the thickness of the thin dielectric layer is in a range of 0.5 nm to 2.5 nm in the direction Y from the center of the reference surface 'a' toward the substrate 100. In some embodiments, the material of the thin dielectric layer includes silicon oxide.

In some embodiments, referring to FIG. 1, the photovoltaic cell may further include a plurality of electrodes 102 each disposed over at least a portion of the reference surface 'a'.

It should be noted that, as an example shown in FIG. 1, an electrode 102 is in contact with a part of the reference surface 'a' and the electrode 102 is not embedded in the second portion 121. In actual application, the electrode 102 may cover the entire reference surface 'a', or the electrode 102 may be embedded in the second portion 121.

In some embodiments, referring to FIGS. 1 and 2, the second portion 121 may further include a third portion 131, a fourth portion 141, and a fifth portion 151. A doping concentration of doping elements in the third portion 131 is greater than a doping concentration of doping elements in the fourth portion 141, and the doping concentration of doping elements in the fourth portion 141 is greater than a doping concentration of doping elements in the fifth portion 151. That is, the doping concentration of doping elements in the third portion 131, the doping concentration of doping elements in the fourth portion 141, and the doping concentration of doping elements in the fifth portion 151 are sequentially decrease. The third portion 131 is closer to the center of the reference surface 'a' than the fourth portion 141, and the fourth portion 141 is closer to the center of the reference surface 'a' than the fifth portion 151. The third portion 131 may include a central region of the reference surface 'a', and protrudes toward the substrate 100. The fourth portion 141 includes a part of a remaining region of the reference surface 'a' (the remaining region of the reference surface 'a' indicates a region of the reference surface 'a' excluding the central region) and covers a surface of the third portion 131 other than the central region of the reference surface 'a'. A remaining portion of the second portion 121 (i.e., a portion of the second portion 121 excluding the third portion and the fourth portion) serves as a fifth portion 151.

It should be appreciated that the third portion 131, the fourth portion 141, and the fifth portion 151 present a gradient distribution of the doping concentration of the doping elements in the second portion 121, the doping concentration gradually decreases from the third portion 131 to the fifth portion 151, and there is no abrupt change in the doping concentration of the doping elements at the contact of the fifth portion 151 with the first portion 111, i.e., the doping concentration of the doping elements in the fifth portion 151 gradually decreases to coincide with the doping concentration of the doping elements in the first portion 111.

In this way, on the one hand, the concentration of the doping elements increases gradually from a low-concentration interface to a high-concentration interface, and the potential barrier of carrier transmission gradually decreases to avoid an abrupt junction in the passivation layer, which avoids the minority carriers to be consumed at the abrupt junction, i.e., increases the width of the depletion region in the passivation layer 101, so as to increase the lifetime of the minority carriers, enhance the passivation effect of the second portion 121 on the substrate 100, and reduce density of the composite current between the electrode 102 and the substrate 100, so that the open circuit voltage and saturation current of the photovoltaic cell is increased, thereby improving the photovoltaic conversion efficiency of the photovoltaic cell. On the other hand, the doping concentration of the doping elements in the second portion 121 presents a gradient distribution, which is conducive to reducing the doping concentration of the doping elements in the first portion 111 while further improving the doping concentration of the doping elements at the contact between the electrode 102 and the second portion 121, so as to reduce the light absorption rate of the first portion 111 while reducing the contact resistance between the second portion 121 and the electrode, which is conducive to improving the light utilization rate of the photovoltaic cell while improving the transmission efficiency of the majority carriers between the second portion 121 and the electrode, thereby improving the photoelectric conversion efficiency of the photovoltaic cell.

It should be noted that FIG. 2 shows a graph of doping concentration distribution of doping elements in the first portion 111 and in a portion of the substrate 100 aligned with the first portion 111, and a graph of doping concentration distribution of doping elements in the second portion 121 and in a portion of the substrate 100 aligned with the second portion 121 in the direction Y from the center of the reference surface 'a' toward the substrate 100. The portion of the substrate 100 aligned with the first portion 111 refers to a portion of the substrate 100 that coincides with an orthographic projection of the first portion 111 on the substrate 100. The portion of the substrate 100 aligned with the second portion 121 refers to a portion of the substrate 100 that coincides with an orthographic projection of the second portion 121 on the electrode 102.

In some embodiments, a ratio of a maximum doping concentration of the doping elements in the second portion 121 to a maximum doping concentration of the doping elements in the first portion 111 is in a range of 3 to 4, for example, may be 3.1, 3.21, 3.3, 3.45, 3.5, 3.64, 3.75, 3.82, 3.9, etc.

It should be appreciated that the doping concentration of the doping elements in the first portion 111 may also fluctuate slightly due to the limitation of the doping process. In addition, if a ratio of the maximum doping concentration of the doping elements in the second portion 121 to the maximum doping concentration of the doping elements in the first portion 111 is less than 3, the maximum doping concentration of the doping elements in the second portion 121, i.e., the doping concentration of the doping elements at the reference surface 'a', is not large enough when the doping concentration of the doping elements in the first portion 111 is small, so that the contact resistance between the second portion 121 and the electrode 102 is still large, which is not conducive to improving the transmission efficiency of the majority carriers between the second portion 121 and the electrode 102. If the ratio of the maximum doping concentration of the doping elements in the second portion 121 to the maximum doping concentration of the doping elements in the first portion 111 is greater than 4, a layout volume of the third portion 131, the fourth portion 141, and the fifth portion 151 in which the doping concentrations of the doping elements gradually decreases needs to be enlarged since the doping concentration of the doping elements at the reference surface 'a' needs to be gradually decreased to the doping concentration of the doping elements at the contact between the second portion 121 and the first portion 111, so that a thickness of the passivation layer 101 in the direction Y from the center of the reference surface 'a' toward the substrate 100 increases, which is not conducive to miniaturization of the photovoltaic cell. Therefore, considering the high doping concentration of the doping elements in the second portion 121 and the size of the passivation layer, the ratio of the maximum doping concentration of the doping elements in the second portion 121 to the maximum doping concentration of the doping elements in the first portion 111 is designed to be in a range of 3 to 4, which facilitates the miniaturization of the photovoltaic cell while reducing the contact resistance between the second portion 121 and the electrode 102.

Referring to FIG. 2, in some embodiments, the doping concentration of the doping elements in the first portion 111 is in a range of $1\times10^{20}$ atom/cm$^3$ to $1.5\times10^{20}$ atom/cm$^3$. In one example, the doping concentration of the doping elements in the first portion 111 may be $1.1\times10^{20}$ atom/cm$^3$.

In some embodiments, the maximum doping concentration of the doping elements in the second portion 121 is in a range of $3\times10^{20}$ atom/cm$^3$ to $4\times10^{20}$ atom/cm$^3$. In one example, the maximum doping concentration of the doping elements in the second portion 121 may be $3.5\times10^{20}$ atom/cm$^3$.

In some embodiments, the minimum doping concentration of the doping elements in the second portion 121 in a range of $1\times10^{20}$ atom/cm$^3$ to $1.5\times10^{20}$ atom/cm$^3$. In one example, the minimum doping concentration of the doping elements in the second portion 121 may be $1.1\times10^{20}$ atom/cm$^3$.

In some embodiments, a grain size of the first portion 111 (i.e., the size of any of grains in the first portion 111) may be greater than a grain size of the second portion 121 (i.e., the size of any of grains in the second portion 121).

It should be understood that the smaller the grain size, the larger the number of grain boundaries in the film layers with the same size, the grain boundaries are interfaces between different grains with the same structure and different orientation. On the one hand, the grain boundary serves as an electron conduction path, the smaller the grain size in the second portion 121, the larger the number of grain boundaries, so that the second portion 121 is able to collect more photogenerated carriers laterally to increase the saturation current of the photovoltaic cell, thereby improving the photoelectric conversion efficiency of the photovoltaic cell. On the other hand, the grain size usually affects physical properties of the film layers. The larger a grain size of a film layer in a certain volume, the greater a deformation resistance of the film layer. For example, microcracks need to consume more energy to cross the grain boundary, so the second portion 121 with smaller grain size has stronger tensile strength and is not prone to bubble formation.

In some embodiments, the ratio of the grain size of the first portion 111 to the grain size of the second portion 121 is in a range of 10 to 30, for example, may be 11.8, 12.6, 13.1, 14.5, 15.3, 16, 17.4, 18.2, 19, 19.5, 22, 24, 26.3, 27, 29.1, etc.

It should be understood that if the ratio of the grain size of the first portion 111 to the grain size of the second portion 121 is less than 10, the difference between the grain size of the first portion 111 and the grain size of the second portion 121 is not large enough to cause the second portion 121 to laterally collect more photogenerated carriers so as to increase the saturation current of the photovoltaic cell. If the ratio of the grain size of the first portion 111 to the grain size of the second portion 121 is greater than 40, the grain size of the first portion 111 is excessively large in the case where the grain size of the second portion 121 meets the requirement, so that the tensile strength of the first portion 111 is excessively low, thereby reducing the overall tensile strength of the passivation layer 101. Therefore, considering the grain size of the second portion 121 and the overall tensile strength of the passivation layer 101, the ratio of the grain size of the first portion 111 and the grain size of the second portion 121 is designed to be in a range of 10 to 30, which is conducive to increasing the overall tensile strength of the passivation layer 101 while increasing the saturation current of the photovoltaic cell.

In some embodiments, the grain size of the first portion 111 is in a range of 100 nm to 300 nm. In some embodiments, the grain size of the second portion 121 is in a range of 10 nm to 30 nm.

In some embodiments, a number of grain boundaries in the first portion 111 is less than a number of grain boundaries in the second portion 121.

From the above analysis, it is seen that the number of grain boundaries in the second portion 121 is larger, which is conducive to causing the second portion 121 to laterally collect more photogenerated carriers so as to increase the saturation current of the photovoltaic cell.

In some embodiments, a ratio of the number of grain boundaries in the second portion 121 to a number of grain boundaries in the first portion 111 is in a range of 20 to 100. From the above analysis, if the ratio of the number of grain boundaries in the second portion 121 to the number of grain boundaries in the first portion 111 is less than 20, the difference between the grain size of the first portion 111 and the grain size of the second portion 121 is not large enough, which is not conducive to causing the second portion 121 to laterally collect more photogenerated carriers so as to increase the saturation current of the photovoltaic cell. If the ratio of the number of grain boundaries in the second portion 121 to the number of grain boundaries in the first portion 111 is greater than 100, the grain size of the first portion 111 is excessively large in the case where the grain size of the second portion 121 meets the requirement, so that the tensile strength of the first portion 111 is excessively low, thereby reducing the overall tensile strength of the passivation layer 101. Therefore, the ratio of the number of grain boundaries in the second portion 121 to the number of grain boundaries in the first portion 111 being designed to be in a range of 20 to 100 is conducive to increasing the saturation current of the photovoltaic cell while increasing the overall tensile strength of the passivation layer 101.

In some embodiments, the number of grain boundaries in the first portion 111 is in a range of 5 to 10 per um$^2$. In some embodiments, the number of grain boundaries in the second portion 121 is in a range of 100 to 500 per um$^2$.

In some embodiments, a dislocation density of the first portion 111 is less than a dislocation density of the second portion 121.

In some embodiments, a ratio of the dislocation density of the first portion 111 to the dislocation density of the second portion 121 is in a range of 2 to 4, for example, may be 2.2, 2.4, 2.6, 2.8, 3, 3.1, 3.3, 3.5, 3.7, 3.9, etc.

In some embodiments, the dislocation density of the first portion 111 is in a range of 5 to 10 per $um^2$. In some embodiments, the dislocation density of the second portion 121 is in a range of 10 to 20 per $um^2$.

In conclusion, the doping concentration of the doping elements in the direction X from the first portion 111 toward the second portion 121 gradually increases, so that the potential barrier for carrier transmission gradually decreases, which is conducive to prolonging the lifetime of the minority carriers, and to enhancing the passivation effect of the second portion 121 on the substrate 100, so as to reduce the composite current density between the electrode 102 and the substrate 100, thereby improving the photoelectric conversion efficiency of the photovoltaic cell, and increasing the open circuit voltage and the saturation current of the photovoltaic cell. Moreover, the doping concentration of the doping elements in the second portion 121 also gradually increases in the direction from the substrate 100 toward the center of the reference surface 'a', which means that the potential barrier for carrier transmission gradually decreases from the second portion 121 to the electrode 102, which is conducive to gradually reducing the transmission resistance of the majority carriers, thereby improving the transmission efficiency of the majority carriers between the second portion 121 and the electrode 102. In addition, on the one hand, it is conducive to reducing the contact resistance between the second portion 121 and the electrode 102 by ensuring a high concentration of the doping elements at the contact between the second portion 121 and the electrode 102, so as to increase the filling factor of the photovoltaic cell. On the other hand, it is conducive to reducing the doping concentration of the doping elements in the first portion 111 by ensuring that a low doping concentration of the doping elements in the first portion 111, so as to reduce the light absorption rate of the first portion 111 and improve the light utilization rate of the photovoltaic cell.

Figure 3:
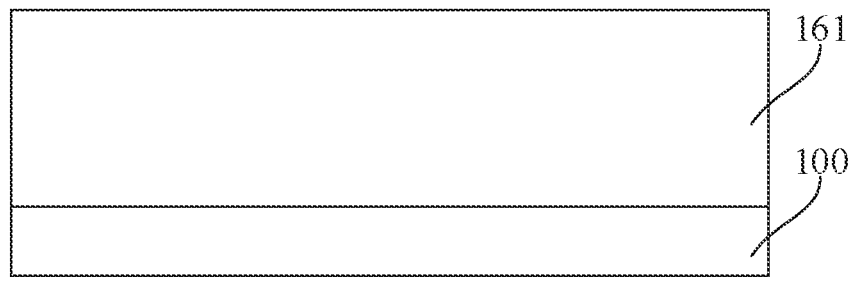
FIG. 3 and FIG. 4 are schematic structural diagrams of operations in a method for preparing a photovoltaic cell according to an embodiment of the present disclosure.
Figure 4:
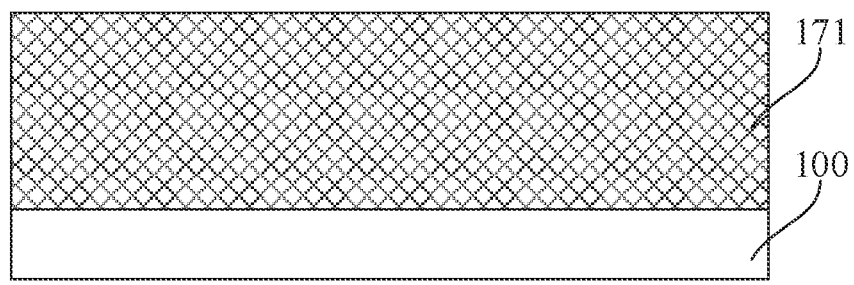

Embodiments of the present disclosure further provide a method for preparing the photovoltaic cell provided in the above embodiments. The method for the photovoltaic cell according to embodiments of the present disclosure is described in detail below with reference to the accompanying drawings. FIG. 3 and FIG. 4 are schematic structural diagrams of operations in a method for preparing a photovoltaic cell according to an embodiment of the present disclosure. It should be noted that the same parts as or corresponding to the above embodiments are not described herein again.

Referring to FIGS. 1, 3, and 4, the method for preparing the photovoltaic cell includes the following operations.

As shown in FIG. 3, the substrate 100 is provided. In some embodiments, the first surface of the substrate 100 may be provided as a pyramid texture surface. The operation of forming the substrate 100 with the pyramid texture surface includes providing an initial substrate, cleaning the initial substrate, and preparing the pyramid texture surface on a first surface of the initial substrate by wet chemical etching to form the substrate 100.

With continued reference to FIG. 3, an initial passivation layer 161 is formed on the first surface of the substrate 100.

In some embodiments, a material of the initial passivation layer 161 includes polysilicon. In some embodiments, the initial passivation layer 161 may be formed on the first surface of the substrate 100 by a low-pressure chemical vapor deposition treatment.

Referring to FIGS. 1, 3, and 4, different regions of the initial passivation layer 161 are treated differently using a doping process to form the passivation layer 101, and the passivation layer 101 includes a plurality of first portions 111 and a plurality of second portions 121 interleaved with each other in a direction X perpendicular to a normal of the first surface of the substrate 100. The plurality of first portions 111 and the plurality of second portions 121 are doped with a same type of doping elements, each second portion 121 has a reference surface 'a' away from the substrate 100, a doping concentration of doping elements in a respective second portion 121 gradually decreases in a direction from the center of the reference surface 'a' toward an adjacent first portion 111 and in a direction from the center of the reference surface 'a' toward the substrate 100, and a doping concentration of doping elements in the first portion 111 is less than or equal to a minimum doping concentration of doping elements in the second portion 121.

In some embodiments, the operation of forming the passivation layer 101 may include, with reference to FIG. 3 and FIG. 4, performing a first doping treatment on the initial passivation layer 161 to form a plurality of initial first portions 171 such that the plurality of initial first portions 171 are doped with the doping elements. With reference to FIG. 4 and FIG. 1, performing a laser doping treatment on a part of a respective initial first portion 171 such that the part of the respective initial first portion 171 is converted into a second portion 121 and a remaining portion of the respective initial first portion 171 is taken as a first portion 111.

In some embodiments, after forming the substrate 100 and before forming the passivation layer 101, the preparing method may further include forming a tunneling layer (not shown) between the substrate 100 and the passivation layer 101. The tunneling layer facilitates chemical passivation of the surface of the substrate 100 to reduce interface state defects of the substrate 100.

In some embodiments, with continued reference to FIG. 1, after forming the passivation layer 101, the preparing method may further include forming a plurality of electrodes 102 each disposed over at least a portion of the reference surface 'a'.

In conclusion, in the photovoltaic cell formed by the method for preparing the photovoltaic cell provided in above embodiments of the present disclosure, the doping concentration of the doping elements gradually increases in the direction X from the first portion 111 toward the second portion 121, so that the potential barrier for carrier transmission gradually decreases, which is conducive to prolonging the lifetime of the minority carriers, and to enhancing the passivation effect of the second portion 121 on the substrate 100, so as to facilitate reducing the composite current density between the electrode 102 and the substrate 100, thereby improving the photoelectric conversion efficiency of the photovoltaic cell, and increasing the open circuit voltage and the saturation current of the photovoltaic cell. Furthermore, the doping concentration of the doping elements in the second portion 121 also gradually increases in the direction from the substrate 100 toward the center of the reference surface 'a', which means that the potential barrier for the carrier transmission is gradually reduced from the second portion 121 to the electrode 102, which is conducive to gradually reducing the transmission resistance of the majority carriers, so as to improve the transmission efficiency of the majority carriers between the second portion 121 and the electrode 102. In addition, on the one hand, it is advantageous to reduce the contact resistance between the second portion 121 and the electrode 102 by ensuring a high concentration of the doping elements at the contact between the second portion 121 and the electrode 102, so as to increase the filling factor of the photovoltaic cell. On the other hand, it is advantageous to reduce the doping concentration of the doping elements in the first portion 111 by ensuring a low doping concentration of the doping elements in the first portion 111, so as to reduce the light absorption rate of the first portion 111 and improve the light utilization rate of the photovoltaic cell.

Figure 5:
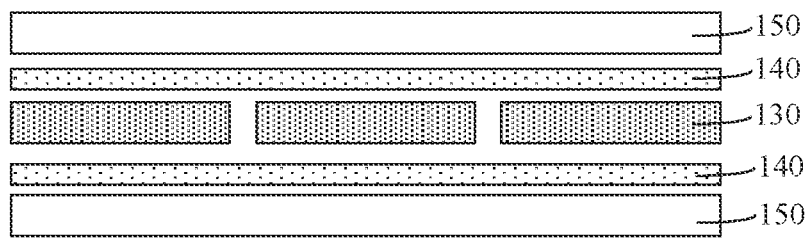
FIG. 5 is a schematic structural diagram of a photovoltaic module according to an embodiment of the present disclosure.

Embodiment of the present disclosure further provide a photovoltaic module for converting received light energy into electrical energy. FIG. 5 is a schematic structural diagram of a photovoltaic module according to an embodiment of the present disclosure.

Referring to FIG. 5, the photovoltaic module includes at least one cell string (at least partially shown in FIG. 5), at least one encapsulation adhesive film 140, and at least one cover plate 150. The at least one cell string is formed by connecting a plurality of photovoltaic cells 130 each may be any of the photovoltaic cells described above (including but not limited to the photovoltaic cell shown in FIG. 1), or may be any of the photovoltaic cells prepared by the method for preparing the photovoltaic cell described above. Adjacent photovoltaic cells 130 are electrically connected by a conductive tape (not shown), and a position relationship between adjacent photovoltaic cells 130 may be either partially overlapping or mutually spliced. The encapsulation adhesive film 140 is configured to cover a surface of a cell string for sealing, and may be an organic encapsulation adhesive film such as an ethylene-vinyl acetate copolymer (EVA) adhesive film, a polyolefin thermoplastic elastomer (POE) adhesive film, or a polyethylene glycol terephthalate (PET) adhesive film. The cover plate 150 covers a surface of the encapsulating adhesive film 140 facing away from the cell string, and may be a transparent or semi-transparent cover plate such as a glass cover plate or a plastic cover plate.

In some embodiments, a trapping light structure is provided on the cover plate 150 to increase the utilization rate of incident light, and trapping light structures of different cover plates 150 may be different. The photovoltaic module has a strong current collecting ability and a low carrier recombination rate, which is able to achieve higher photoelectric conversion efficiency. In some embodiments, a front face of the photovoltaic module is dark blue or even black, which is able to be applied to more scenes.

In some embodiments, the encapsulant adhesive film 140 and the cover plate 150 are disposed only on the front surface of the photovoltaic cell 130, avoiding further blocking and weakening of weaker light in the case where the encapsulant adhesive film 140 and the cover plate 150 are disposed on the rear surface. Meanwhile, the photovoltaic module may be side fully enclosed, i.e., the side edges of the photovoltaic module are completely enclosed by the encapsulation adhesive film 140, so as to prevent the photovoltaic module from being laminated offset during a lamination process, and prevent the performance of the photovoltaic cell from being affected by external environment through the side edges of the photovoltaic module, such as water vapor intrusion.

In conclusion, since the concentration distribution trend of the doping elements in the first portion 111 and the second portion 121 in the photovoltaic cell in the photovoltaic module is conducive to improving the photoelectric conversion efficiency of the photovoltaic cell 130, the photoelectric conversion efficiency of the cell string formed by connecting the plurality of photovoltaic cells 130 is improved, and the photoelectric conversion efficiency of the photovoltaic module including the cell string is improved.

Those of ordinary skill in the art should appreciate that the embodiments described above are specific embodiments of the present disclosure, and in practical application, various changes may be made thereto in form and detail without departing from the spirit and scope of the present disclosure. Any person skilled in the art may make his or her own changes and modifications without departing from the spirit and scope of the present disclosure. Therefore, the protection scope of the present disclosure shall be subject to the scope limited by the claims.

What is claimed is:

1. A method for preparing a photovoltaic cell, comprising:
    providing a substrate;
    forming an initial passivation layer on a first surface of the substrate, and
    performing doping treatments on the initial passivation layer to form a passivation layer having a plurality of first portions and a plurality of second portions interleaved with each other in a direction perpendicular to a normal of the first surface of the substrate;
    wherein the plurality of first portions and the plurality of second portions are doped with a same type of doping elements, each respective second portion of the plurality of second portions has a respective reference surface away from the substrate, a doping concentration of doping elements in the respective second portion gradually decreases in a direction from a center of the respective reference surface toward an adjacent first portion and gradually decreases in a direction from the center of the respective reference surface toward the substrate, and a doping concentration of doping elements anywhere in the adjacent first portion is less than or equal to a minimum doping concentration of doping elements in the respective second portion.

2. The method of claim 1, wherein doping the initial passivation layer includes:
    performing a first doping treatment on the initial passivation layer to form a plurality of initial first portions such that the plurality of initial first portions are doped with the doping elements; and
    performing a laser doping treatment on part of a respective initial first portion such that the part of the respective initial first portion is converted into a second portion and a remaining portion of the respective initial first portion becomes a first portion.

3. The method of claim 1, wherein the method further comprises:
    after providing the substrate and before doping the initial passivation layer,
    forming a tunneling layer between the substrate and the initial passivation layer, wherein the tunneling layer has a thickness in a range of 0.5 nm to 2.5 nm in a direction perpendicular to the first surface of the substrate.

4. The method of claim 1, wherein the method further comprises:
    after doping the initial passivation layer, forming a plurality of electrodes each disposed over at least a portion of a reference surface of a respective second portion of the plurality of second portions.

5. The method of claim 1, wherein the respective second portion further includes a third portion, a fourth portion, and a fifth portion, and a doping concentration of doping elements in the third portion is greater than a doping concentration of doping elements in the fourth portion, which is greater than a doping concentration of doping elements in the fifth portion;

wherein the third portion is closer to the center of the reference surface than the fourth portion, and the fourth portion is closer to the center of the reference surface than the fifth portion.

6. The method of claim 1, wherein a ratio of a maximum doping concentration of the doping elements in the respective second portion to a maximum doping concentration of the doping elements in the corresponding first portion is in a range of 3 to 4.

7. The method of claim 6, wherein the doping concentration of the doping elements in the corresponding first portion is in a range of $1 \times 10^{20}$ atom/cm$^3$ to $1.5 \times 10^{20}$ atom/cm$^3$, the maximum doping concentration of the doping elements in the respective second portion is in a range of $3 \times 10^{20}$ atom/cm$^3$ to $4 \times 10^{20}$ atom/cm$^3$, and the minimum doping concentration of the doping elements in the respective second portion is in a range of $1 \times 10^{20}$ atom/cm$^3$ to $1.5 \times 10^{20}$ atom/cm$^3$.

8. The method of claim 1, wherein a grain size of the corresponding first portion is greater than a grain size of the respective second portion.

9. The method of claim 8, wherein a ratio of the grain size of the corresponding first portion to the grain size of the respective second portion is in a range of 10 to 30.

10. The method of claim 9, wherein the grain size of the corresponding first portion is in a range of 100 nm to 300 nm and the grain size of the respective second portion is in a range of 10 nm to 30 nm.

11. The method of claim 1, wherein a number of grain boundaries in the corresponding first portion is less than a number of grain boundaries in the respective second portion.

12. The method of claim 11, wherein a ratio of the number of grain boundaries in the respective second portion to the number of grain boundaries in the corresponding first portion is in a range of 20 to 100.

13. The method of claim 12, wherein the number of grain boundaries in the corresponding first portion is in a range of 5 to 10 per um$^2$, and the number of grain boundaries in the respective second portion is in a range of 100 to 500 per um$^2$.

14. The method of claim 1, wherein a dislocation density of the corresponding first portion is less than a dislocation density of the respective second portion.

15. The method of claim 14, wherein a ratio of the dislocation density of the corresponding first portion to the dislocation density of the respective second portion is in a range of 2 to 4.

16. The method of claim 15, wherein the dislocation density of the corresponding first portion is in a range of 5 to 10 per um$^2$, and the dislocation density of the respective second portion is in a range of 10 to 20 per um$^2$.

17. The method of claim 1, wherein a type of the doping elements in the passivation layer is the same as a type of the doping elements in the substrate.

18. The method of claim 1, wherein forming the passivation layer comprises:

forming the passivation layer having a thickness in a range of 30 nm to 150 nm in a direction perpendicular to the first surface of the substrate.

19. The method of claim 4, wherein each electrode of the plurality of electrodes is in contact with the portion of the reference surface and is not embedded in the respective second portion.

20. The method of claim 4, wherein each electrode of the plurality of electrodes covers the entire reference surface, and is embedded in the respective second portion.

* * * * *